United States Patent
Slonaker

Patent Number: 6,025,099
Date of Patent: Feb. 15, 2000

[54] FIELD CURVATURE CORRECTION UTILIZING SMOOTHLY CURVED CHUCK FOR SUBSTRATE EXPOSURE IN ELECTRONICS MANUFACTURING

[76] Inventor: Steven Douglas Slonaker, 564 S. El Camino Real, San Mateo, Calif. 94402

[21] Appl. No.: 08/893,260

[22] Filed: Jul. 17, 1997

Related U.S. Application Data

[63] Continuation-in-part of application No. 08/356,061, Dec. 14, 1994, abandoned, which is a continuation-in-part of application No. 08/235,758, Apr. 29, 1994, abandoned.

[51] Int. Cl.[7] .................................................. G03F 9/00
[52] U.S. Cl. ............................................ 430/30; 430/311
[58] Field of Search .................. 430/30, 311; 250/492.2; 356/373, 376

[56] References Cited

U.S. PATENT DOCUMENTS

| | | | |
|---|---|---|---|
| 4,609,285 | 9/1986 | Samuels | 355/75 |
| 4,788,577 | 11/1988 | Akiyama et al. | 355/53 |
| 5,184,176 | 2/1993 | Unno et al. | 355/52 |

*Primary Examiner*—Christopher G. Young
*Attorney, Agent, or Firm*—Richard E. Oney; Norman E. Brunell

[57] ABSTRACT

The layer of photoresist on a substrate to be exposed is deformed to approximate the shape of the region of best focus of the image to be projected thereon. The region of best focus is projected into a central region of the resist throughout the exposure field of the image. The deformation is accomplished by conforming the substrate with vacuum to a smoothly curved or spherically curved, permanent, rigid surface in a substrate chuck holding the substrate. The substrate chuck is mounted for motion on a substrate stage so that multiple exposure fields may be formed in the resist.

16 Claims, 3 Drawing Sheets

FIELD CURVATURE CORRECTION UTILIZING SMOOTHLY CURVED CHUCK FOR SUBSTRATE EXPOSURE IN ELECTRONICS MANUFACTURING

CROSS REFERENCE TO RELATED APPLICATIONS

This is a continuation-in-part application of U.S. patent application Ser. No. 08/356/061 filed Dec. 14, 1994, now abandoned which is a continuation-in-part of U.S. patent application Ser. No. 08/235,758 filed Apr. 29, 1994.

BACKGROUND OF THE INVENTION

1. Field of the Invention

This invention relates to techniques for manufacturing substrate-based electronics such as integrated circuits, Liquid Crystal Display panels, and Printed Circuit boards. In particular, this invention relates to techniques for minimizing the negative effects of field curvature during the exposure of a substrate in the lithography portion of the manufacturing process.

2. Description of the Prior Art

In accordance with conventional manufacturing techniques, substrates are coated with a thin layer of an ultraviolet light-sensitive chemical, called photoresist, or more commonly, simply resist. The substrate material varies depending upon what electronic component is being manufactured. In the case of integrated circuit manufacture, the substrates are thin disks, called substrates, usually of silicon, on the order of 100 to 200 mm in diameter. In the case of manufacturing Printed Circuit Boards, referred to as PCBs, the substrate material and size vary widely, but typically are some plastic material. In the case of manufacturing Liquid Crystal Display panels, referred to as LCD panels, the substrates are typically a glass material, but many other materials could be used. During the exposure step in the manufacturing process, the coated substrates are mounted on a platform called a chuck, and typically held in place by vacuum applied from below.

The chuck is usually mounted on a swiveling or pivoting platform called a substrate stage, or simply stage, which is used to move the chuck, and therefore the substrate mounted thereon, both up and down, front to back and side to side. In recently developed lithography exposure tools, the stage can be rotated to tip and tilt the substrate from side to side and front to back at each exposure location.

During exposure of the substrate, imaging radiation, usually ultraviolet light, is passed through a matrix of opaque and transparent regions, called a mask, which includes an image to be applied to the substrate. An imaging system, usually an optical projection lens between the mask and the resist-coated substrate, is used to focus the image of the mask onto some portion of the resist-coated substrate. This or any region of the substrate which is exposed with a single image of the mask is known as an exposure field. In the process of step-and-repeat lithography, after exposure of one exposure field, the stage is moved and a portion of the resist-coated substrate adjacent to the previous exposure field is then exposed. This process is repeated until an array of exposures substantially covers the surface of the substrate. In accordance with conventional techniques, the resist is developed after exposure to leave a resist pattern on the substrate. The substrate is then processed by etching, ion beam radiation, diffusion, or some other technique to form the desired pattern having some desired characteristics. Then the resist is removed, and the entire process may be repeated with a different mask to form some other pattern on the substrate. This process may be repeated many times until all desired circuit layers have been formed in the substrate. In the case of integrated circuit manufacture, the individual circuit patterns contained in the exposure fields in the substrates are then physically separated to form a series of identical semiconductor chips.

As the circuit element density required in the exposure of substrates, in particular integrated circuit chips, has increased, and the resulting minimum linewidths being exposed has correspondingly decreased, it has become more and more difficult to properly focus the mask image on and in the resist to provide a high resolution image. The projection lens typically used to apply the image to the resist has been developed to include 10 to 25 or more individual lenses or lens elements arranged in a group in an effort to provide maximum resolution. However, the inability to further improve image resolution is still a limiting factor in increasing the density of exposed images in the PCBs, LCD panels, and in particular, the integrated circuits now being manufactured.

One of the major remaining factors limiting further improvement in image resolution on PCBs, LCD panels, and integrated circuit substrates, is field curvature. In conventional manufacturing techniques, the layer of resist in which the image is to be formed is very thin and flat, typically on the order of 1.0 to 1.5 microns thick. During exposure of the mask image onto the resist layer, the best image position, or region of best focus, is targeted to be approximately halfway through the thickness of the resist layer. It has been the general goal of conventional lithography exposure tools to attempt to maintain the resist layer as flat as possible during exposure. This is because an effectively flat image field has been the design goal of the designers and manufacturers of the projection lenses utilized. However, due to the physics of the imaging process, the lens designers must attempt to balance other categories of image-degrading aberrations against field curvature. The result is that although conventional lens designs attempt to maintain an effectively flat exposure field over the region being exposed, some amount of field curvature is usually present. The lens manufacturing processes often add additional undesired field curvature.

Substrate deforming techniques have been developed in an attempt to reduce the effects of field curvature on resolution. Such conventional techniques typically provide a series of vertically adjustable points used to deform subsets of the substrate surface. Such techniques may use stage movement to help minimize the effects of field curvature on resolution.

As shown for example in U.S. Pat. Nos. 4,666,291, 4,788,577, and No. 5,184,176, some conventional substrate-deforming mechanisms and procedures require vertical movement of at least a subset of surfaces built in the chuck. These techniques can only simulate a spherical contact surface between the chuck and the substrate, in part because each point of contact with the substrate resulting from a vertical adjustment maintains it original slope. As a result, most if not all such points of contact between the chuck and the substrate are not part of a single spherical surface.

Another conventional approach is shown, for example, in U.S. Pat. No. 4,688,932, in which a particular pattern of movement of the stage during exposure is used to attempt to compensate for field curvature.

What are needed are techniques for improving the effective resolution of the mask images applied to the resist during the lithographic exposure process.

SUMMARY OF THE INVENTION

In accordance with the present invention, it has been recognized that when using conventional lithography tools, the region of best focus of the mask image typically may lie in a curved, rather than flat, plane. The curvature of the region of best focus across an exposure field may in fact exceed even the thickness of the flat resist layer on the substrate. This effect leads to degraded images when trying to expose very small linewidths, and ultimately limits the minimum linewidths manufacturable in the lithography process. Additionally, the negative effects of field curvature are widely known to ultimately negatively impact the production yield of working devices.

In accordance with the present invention, improved resolution is achieved by compensating for the curvature of the curved region of best focus of conventional lithography tools. In particular, the substrate with its layer of resist coating is deformed, for example, by being forced to conform to a smoothly curved surface on the chuck on which the substrate is secured during the exposure sequences. The forces applied to secure the substrate to the chuck may be from a conventional vacuum used to clamp a substrate to its chuck. Although the curvature of the chuck and the resultant curvature of the substrate and its layer of resist compensates for the field curvature from the imaging system when held static during exposure, in certain implementations it may be advantageous to move the stage during exposure such as in a scanning lithography exposure tool.

In one aspect, the present invention provides that the entire top surface of the chuck is a smoothly curved surface. This requires specific consideration of all points of contact between the substrate and the chuck. All such points of contact are then on the smoothly curved surface, such as a spherically curved surface, or a cylindrically curved surface. The upper surface of the chuck may be formed from a rigid sheet of glass or steel, forged or ground to have a smooth cylindrical or spherical concave upper surface. The chuck must have sufficient rigidity that the application of a vacuum between the upper surface of the chuck and the substrate causes the substrate to conform to the shape of the upper surface of the chuck with no deformation of the chuck.

In another aspect, the present invention provides a method for causing the shape of a layer of photoresist on a substrate to conform to the field curvature of the region of best focus of a mask image. A radiation source is used to expose the layer of photoresist to the mask image. The substrate is temporarily secured to the upper surface of a chuck that has previously been formed into a permanent, concave, spherical or cylindrical shape. Thereafter, during exposure, the substrate and the resist layer are secured to the upper surface of the chuck. The resist layer is thereby deformed into a curved shape to approximate the curvature of the image field projected by the projection lens. The image is thus applied to the photoresist layer on the substrate so that the region of best focus of the projected image lies within the center of the layer of photoresist throughout the entire exposure field.

In a still further aspect, the present invention provides a system for temporarily changing the curvature of a surface to be exposed, to be equal to the field curvature of the region of best focus of an image to be projected thereon. The system provides a smooth, rigid, permanently curved surface which approximates the shape of the field curvature of a region of best focus of a projected image. A vacuum system or other conventional technique is used to secure the surface to be exposed to the curved surface of the chuck during the exposure process. It is important to note that the present invention provides a permanent smooth surface used to secure the surface to be exposed. The continuous smooth surface provides a superior approximation of the field curvature than the multipoint approximation, or the multiple flat plate approximation of field curvature provided by conventional devices.

In a still further aspect, the present invention provides a system for deforming the shape of a layer of photoresist on a substrate to the shape of the field curvature of the region of best focus of the image projected into a central region of the photoresist layer.

In another still further aspect of the present invention, a method for exposing photoresist on a substrate to form an image thereon is provided. A layer of photoresist is deposited on a surface of a substrate. An image is projected using a radiation source. The projected image is focused using a projection lens, thus creating a curved region of best focus. The curvature of the region of best focus is measured by any conventional means. The upper surface of a chuck is permanently modified to form a smooth permanent curve generally identical to the curvature of said region of best focus. The deposited photoresist layer is conformed to the curvature of the region of best focus by temporarily securing the substrate to the smooth permanently curved upper surface of the chuck such that the photoresist layer is opposite the side of the substrate in contact with the smooth permanently curved upper surface of said chuck. The layer of photoresist is irradiated with the projected image to form a first exposure field, and the region of best focus of the first exposure field is positioned substantially within the layer of photoresist.

These and other features and advantages of this invention will become further apparent from the detailed description and accompanying figures that follow. In the figures and description, numerals indicate the various features of the invention, like numerals referring to like features throughout both the drawings and the description.

DETAILED DESCRIPTION OF THE PREFERRED EMBODIMENTS

Figure 1:
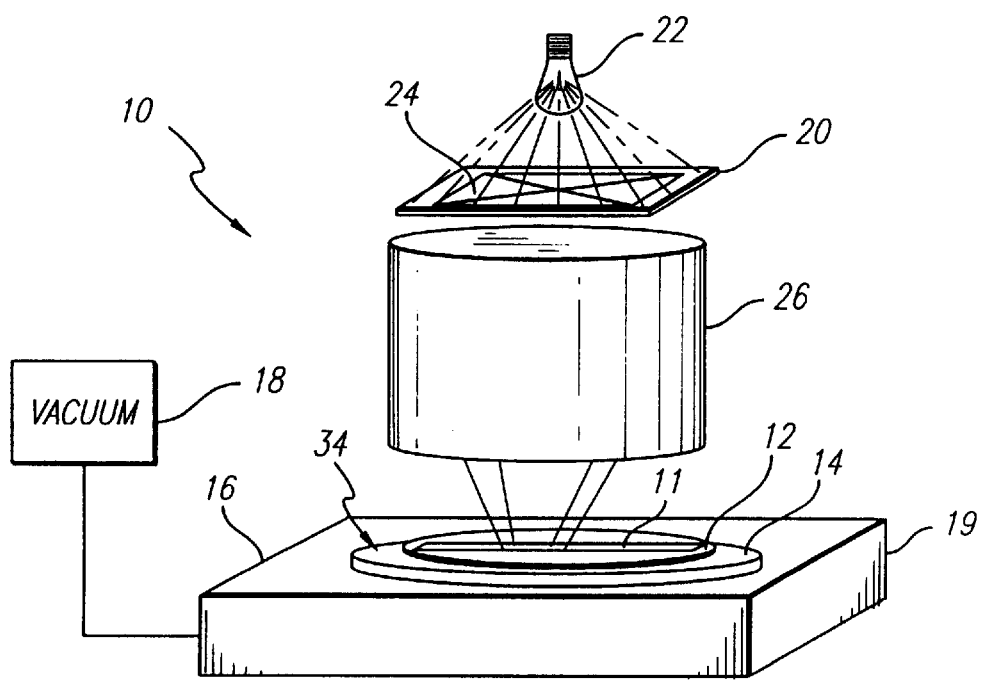
FIG. 1 is an isometric view of a substrate exposure system for use in electronics manufacturing, in accordance with the present invention.

Referring now to FIG. 1, an isometric view of substrate exposure system 10 is shown, in accordance with the present invention, in which substrate 12 is secured by chuck 14 on stage 16. Vacuum is applied by vacuum source 18 through stage 16 and chuck 14 to secure substrate 12 to chuck 14.

Chuck 14 may preferably be formed, before substrate 12 is mounted on chuck 14, from a rigid sheet of glass or steel, forged or ground to have a smooth cylindrical or spherical concave upper surface such as curved upper surface 34. Chuck 14 must be rigid enough so that the application of a vacuum between curved upper surface 34 and substrate 12 conforms substrate 12 to the shape of curved upper surface 34 without causing deformation of the smoothly curved cylindrical or spherical surface of chuck 14.

Chrome mask 20 is illuminated by UV source 22 to apply mask pattern 24, shown for convenience simply as a bordered "X" shape, through projection lens 26 onto substrate 12. As shown in FIG. 1, exposure field 11 is only a portion of the total area of substrate 12. This is typical of step-and-repeat lithography. In step-and-repeat lithography, after exposure field 11 is exposed, stage 16, as driven under the control of a stage and chuck motion controller, would move chuck 14 and substrate 12 so that a different portion of the total area of substrate 12 is centered beneath projection lens 26, and then execute an exposure of that different portion of substrate 12. It is also possible that only a single exposure onto substrate 12 is desired, in which case substrate 12 would be unloaded from substrate exposure system 10 after only a single area being exposed. However, in accordance with current manufacturing techniques, it is more typical for multiple regions of substrate 12 be exposed by each mask pattern 24. Projection lens 26 is a conventional, multi-element high-resolution lens discussed in greater detail below with regard to FIG. 2.

Figure 2:
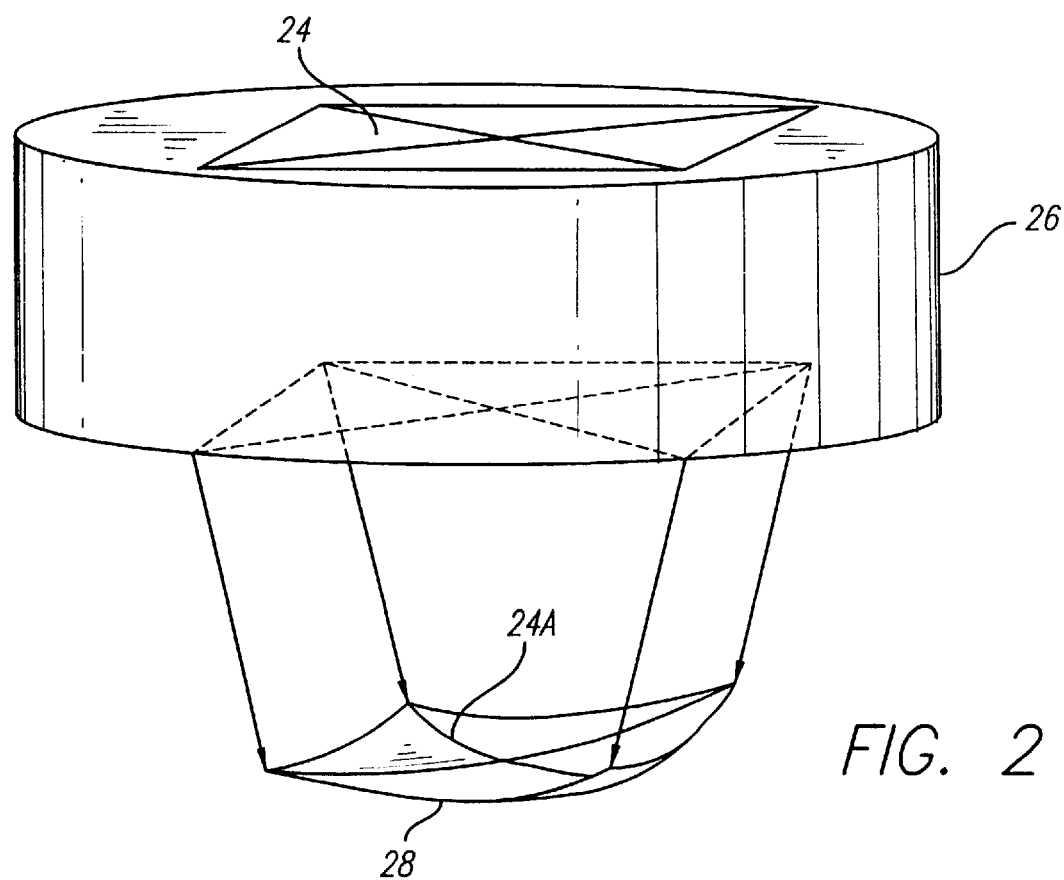
FIG. 2 is an isometric view of the region of best focus of the image from the projection lens shown in FIG. 1.

Referring therefore now to FIG. 2, projection lens 26 projects the illumination from UV source 22 through chrome mask pattern 24 to produce a projected version of mask pattern 24 which lies in a region of best focus 28 as a result of lens 26. Image 24A, the projected version of mask pattern 24, may be any magnified version of mask pattern 24. It is important to note that the region of best focus 28 of the projected image 24A from projection lens 26 does not lie on a flat planar surface, but lies on a curved surface generally illustrated as region of best focus 28 of image 24A.

Figure 3:
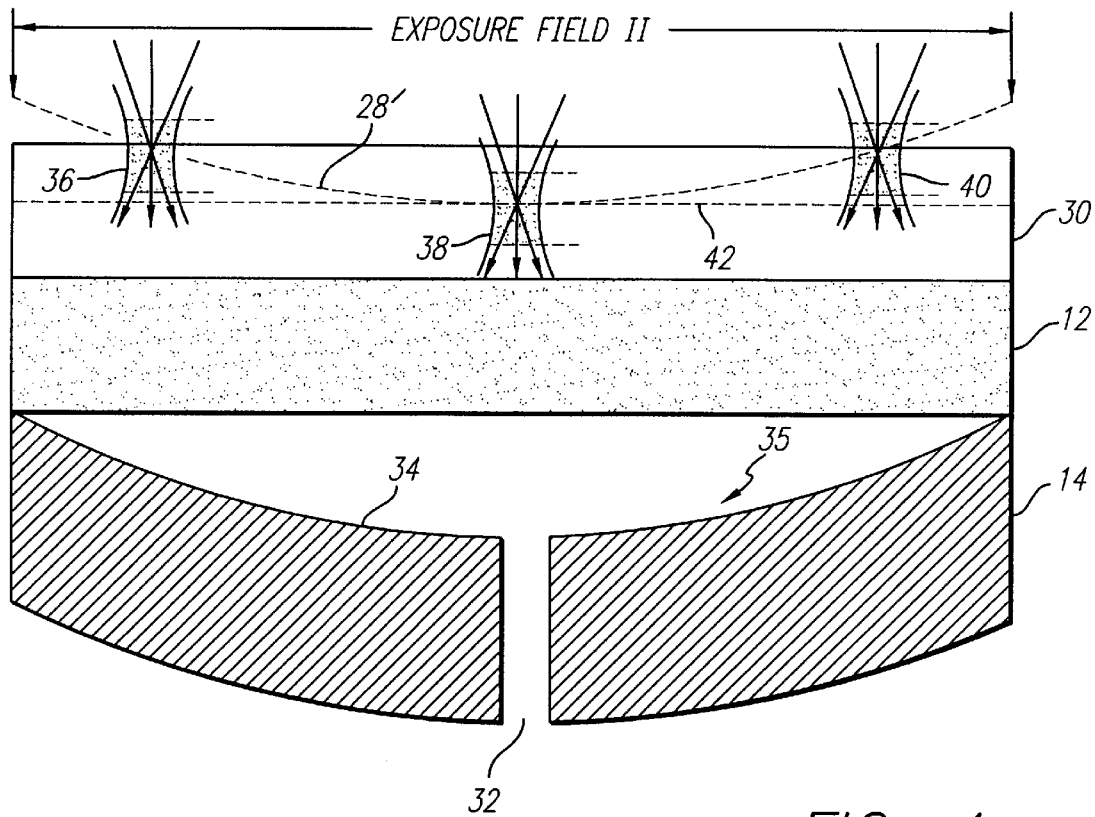
FIG. 3 is a cross sectional view of a substrate with a resist layer positioned on a substrate chuck before application of vacuum to draw the substrate and its resist layer into a spherically curved shape, conforming to the spherically curved top surface of the chuck, in accordance with the present invention.

FIG. 3 shows a cross sectional view of an exposure field 11 portion of substrate 12, including resist layer 30, positioned above vacuum ports 32 of chuck 14. It is important to note that curved upper surface 34 of chuck 14 is smoothly curved with only vacuum ports 32 as discontinuities. In this example, curved upper surface 34 is spherically curved concave upward, to approximate the curved shape of the region of best focus 28 of image 24A. Note that the specific radius of curvature of curved upper surface 34, and whether it is curved concave upward or downward, depends upon the imaging characteristics of the particular projection lens 26 being utilized.

Figure 5:
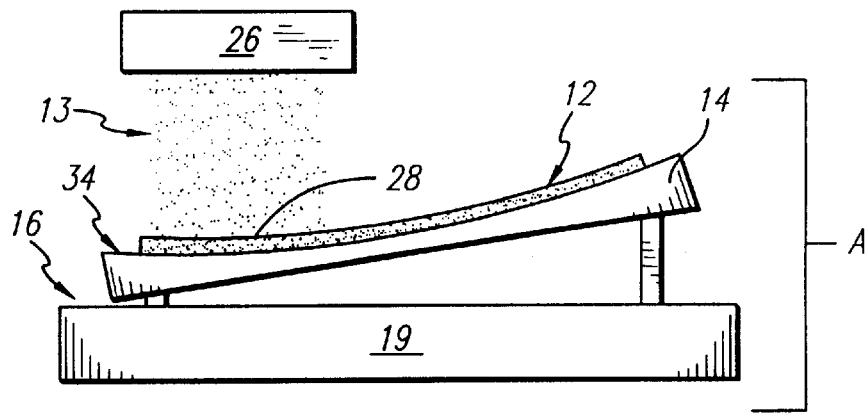
FIGS. 5a, 5b and 5c are cross sectional views of a spherically deformed substrate with a resist layer attached to a spherically shaped chuck which is itself carried atop a substrate stage.
Figure 5:
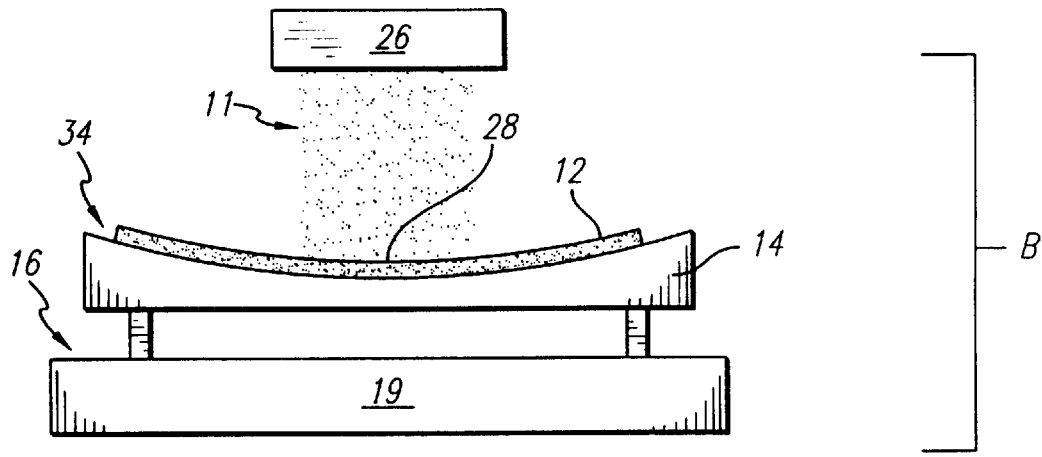
Figure 5:
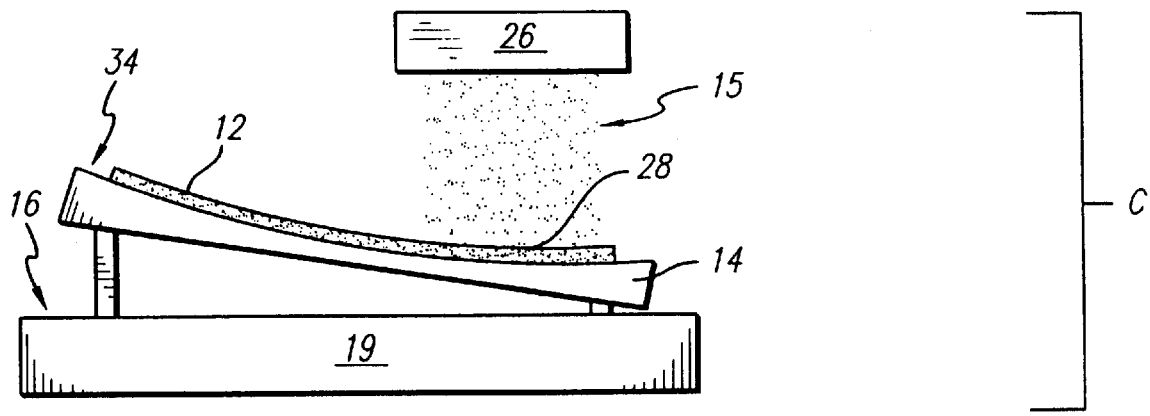

The surface curvature required for chuck 14 is determined by the optical characteristics of the projection lens, such as projection lens 26, to be used. The radius of curvature of region of best focus 28 may be either measured or calculated for the projection lens to be used. A continuous smooth curve, curve 35, is then either ground or forged into the upper surface of chuck 14 using the radius of curvature previously measured or calculated. The area of curved upper surface 34 which is curved must be large enough to encompass substrate 12, and the entire upper surface of chuck 14 may be curved as shown in FIG. 5. Curved upper surface 34 duplicates as closely as possible the curvature of region of best focus 28 across an area of chuck 14 sufficient to encompass substrate 12. Curve 35 is a continuous smooth curve across curved upper surface 34 and curve 35 may be cylindrical or spherical. Vacuum ports 32 may be created either before or after curve 35 is formed in curved upper surface 34.

Curved upper surface 34 is rigid and is formed before chuck 14 is used for mounting and then exposing substrate 12. It is important that upper surface 34 is sufficiently rigid to hold its shape and not be deformed by the application of vacuum or other processing activities.

In FIG. 3, vacuum from vacuum source 18 has not yet been applied through vacuum ports 32 to the space between the approximately flat bottom of substrate 12 and curved upper surface 34 of chuck 14. This figure illustrates some of the difficulties in conventional systems in that the shape of substrate 12, and therefore resist layer 30, has not yet been modified in accordance with the present invention.

Within resist layer 30 is a central plane 42, corresponding to a plane approximately halfway through the thickness of resist layer 30. Optimum resolution of image 24A from mask pattern 24 of FIG. 1 is obtained when the region of best focus 28 is coincident with the central plane 42. Any lack of coincidence between the region of best focus 28 and the central plane 42 results in degraded imaging capability.

For the purpose of illustrating the resolution problems of conventional systems, three points across a single exposure field 11 are shown, referred to as pixels 36, 38, and 40. Each pixel represents the imaging of a single point from mask pattern 24 into exposure field 11. The shape of these cross sectional views of the pixels shows how the image of a point will have a single position in the direction of the axis of the imaging optics, vertical as shown in the figure, where absolute best imaging is obtained. The set of best imaging positions from all pixels in the entire exposure field, including those not detailed in this figure, defines the region of best focus 28. The horizontal width of each of the pixels displayed in FIG. 3, and the variation in their width through the height of each within resist layer 30, represents the spreading, or degrading, of each point within image 24A as the vertical position being considered moves above or below the region of best focus 28. As noted above, central region 42 of resist layer 30 is located approximately halfway through the thickness of resist layer 30. Examination of FIG. 3 shows that the curved region of best focus 28 of image 24A clearly does not coincide with the flat central plane 42 of resist layer 30. In particular, the best focus position of pixel image 38 is indeed optimally located in coincidence with central plane 42, while the best focus of pixel images 36 and 40, which are also part of the region of best focus 28, are not located in coincidence with central plane 42. As a result, images of pixels 36 and 40 may still result after exposure and develop, but they will be degraded with respect to optimum imaging. For example, they will be degraded in comparison to the developed image of pixel 38.

Figure 4:
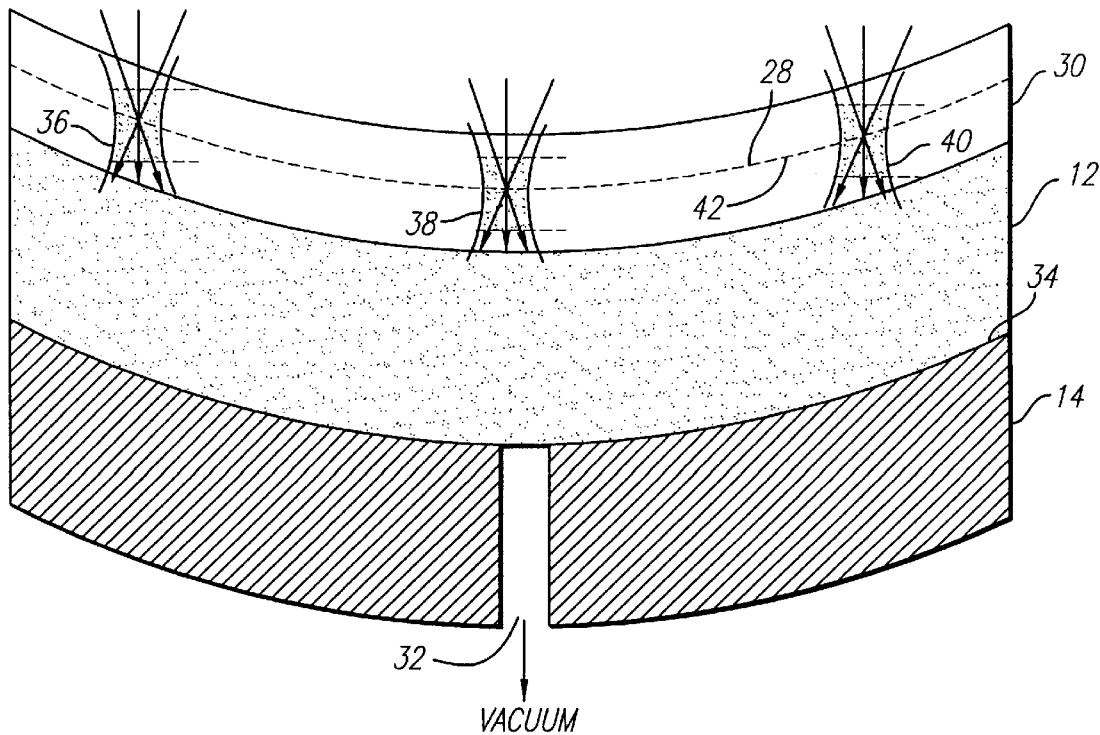
FIG. 4 is a cross sectional view of the substrate and chuck assembly shown in FIG. 3 after vacuum has been applied to the chuck, in accordance with the present invention.

Referring now to FIG. 4, vacuum from vacuum source 18 shown in FIG. 1 has been applied through vacuum ports 32 to the space between the bottom of substrate 12 and curved upper surface 34 so that substrate 12 has been caused to conform to the shape of curved upper surface 34. Similarly, resist layer 30 on substrate 12 will also be forced to conform to curved upper surface 34. Because curved upper surface 34 has been shaped specifically to best approximate the shape of the curved region of best focus 28, substrate exposure system 10 can be adjusted so that the region of best focus 28 of image 24A lies centrally within the depth of resist layer 30. That is, central plane 42 of resist layer 30 is deformed to coincide with the region of best focus 28 of image 24A. As a result, the exposed and developed images of all pixels, including pixels 36, 38 and 40, will show better optimized resolution capability over a wider range of absolute axial displacement tolerance, that is, displacement tolerance along the optic axis of the imaging system. For chuck 14 to function properly, chuck 14 must be sufficiently rigid to resist deformation when a vacuum is applied between curved upper surface 34 and substrate 12.

A major benefit of the present invention is illustrated clearly in FIG. 4 in that pixels 36 and 40, as well as pixel 38, are all located along the region of best focus 28. In actual practice, there is always some slight error present in the positioning of chuck 14 by stage 16. However, by appropriately curving the upper surface 34 of chuck 14 to approximate the curvature of the region of best focus 28, the amount of tolerance to such positioning error will be drastically increased. The result is improved minimum linewidths which are manufacturable over the entire exposure field, as well as improved allowed focus tolerance. Since it is generally accepted in the electronics manufacturing industry that improved focus tolerance, or effective depth of focus, leads to improved production yield of working devices, the present invention would likewise lead to improved production yield.

Referring now to FIGS. 5a, 5b and 5c, a stage and chuck motion controller is used to position substrate 12 at different locations for each exposure field during step and repeat lithography. As illustrated for example in FIG. 5b, for a central exposure field 11, chuck 14 is positioned parallel to substrate stage 16 so that the central portion of substrate 12 is located below projection lens 26. Vacuum has been applied to chuck 14 so that substrate 12 has been caused to conform to the smoothly curved surface of curved upper surface 34 so that region of best focus 28 falls centrally within resist layer 30, as illustrated in FIG. 4.

FIG. 5a illustrates the positioning of substrate 12 during the exposure of another exposure field, exposure field 13, positioned on the left side of substrate 12 as shown. Stage and chuck motion controller 19 causes substrate stage 16 to move to the right so that exposure field 13 is again located directly under projection lens 26. Because substrate 12 has been caused to conform to the smoothly curved shape of curved upper surface 34, chuck 14 has to be rotated or tilted for exposure field 13 to maintained the desired relationship between region of best focus 28 and resist layer 30.

In particular, for a projection lens 26 having a spherically curved region of best focus 28, chuck 14 can easily be moved and titled to maintain the center of the spherical surface at a fixed position. In other words, substrate 12 is curved to fit the spherical surface of curved upper surface 34 and moved to stay along extensions of that same spherical surface.

FIG. 5c illustrates the positioning of substrate 12 during the exposure of exposure field 15 positioned on the right side of substrate 12 as shown. In the same manner as depicted with regard to FIG. 5a, stage and chuck motion controller 19 causes substrate stage 16 to position substrate 12 so that exposure field 15 is directly under projection lens 26. Chuck 14 is caused to rotate or tilt so that region of best focus 28 lies centrally within resist layer 30. Although only three exposures field have been illustrated in FIGS. 5a, 5b and 5c, many more exposure fields would be accommodated in a typical step and repeat lithography implementation.

In accordance with the present invention, it is only necessary that the curved substrate 12 is spherical or cylindrical in its curvature, so that the central plane 42 of resist layer 30 is spherically or cylindrically curved to best coincide with the region of best focus, while simultaneously being able to present, with proper stage positioning compensation, an identically curved surface beneath projection lens 26 from all portions of substrate 12.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

What is claimed is:

1. A method for exposing photoresist on a substrate to form an image thereon, comprising the steps of:

providing a ground or forged chuck upper surface in the form of a rigid, smoothly curved surface, the shape of said ground or forged surface approximating the shape of a region of best focus of an image to be projected; and then conforming a substrate having a layer of photoresist thereon to the shape of the ground or forged chuck upper surface; and then irradiating said layer of photoresist with said projected image to form a first exposure field, said region of best focus of said first exposure field being positioned substantially within said layer of photoresist.

2. The method of claim 1, wherein the step of conforming the layer of photoresist further comprises the step of:

applying vacuum between the ground or forged chuck upper surface and the substrate.

3. The method of claim 1, further comprising the steps of:

mounting the ground or forged chuck upper surface on a movable substrate stage;

moving the substrate stage and tilting the ground or forged chuck upper surface to position the region of best focus of the project image in a previously unexposed portion of the substrate; and forming a second exposure field in the layer of photoresist.

4. The method of claim 2 wherein said ground or forged chuck upper surface is a substantially spherical or cylindrical surface.

5. The method of claim 1 wherein the step of providing a ground or forged chuck upper surface in the form of a rigid, smoothly curved surface further comprises the step of:

spherically or cylindrically forging or grinding a glass or steel surface to form a rigid, smoothly curved surface.

6. A method for exposing photoresist on a substrate to form an image thereon, comprising the steps of:

permanently shaping an area of an upper surface of a rigid chuck to form a smooth permanent curve approximating the curvature of said region of best focus; and then projecting a focused image formed by a radiation source, through a projection lens onto a 1–1.5 micron layer of photoresist on a substrate, said focused image having a curved region of best focus;

conforming said photoresist layer to the curvature of said region of best focus by securing said substrate having said deposited photoresist layer thereon to said smooth permanently curved upper surface of said rigid chuck; and irradiating said layer of photoresist with said projected image to form a first exposure field, said region of best focus of said first exposure field being positioned substantially within said layer of photoresist.

7. The method of claim 6, wherein the curvature of said curved region of best focus exceeds the thickness of said deposited photoresist layer before said photoresist layer is conformed to the curvature of said region of best focus.

8. The method of claim 7, wherein the step of irradiating said layer of photoresist with said projected image to form a first exposure field further comprises the step of:

positioning said region of best focus of said first exposure field in the center of said layer of photoresist.

9. The method of claim 8, wherein the step of projecting a focused image formed by a radiation source, through a projection lens creating a curved region of best focus further comprises the step of:

projecting a focused image formed by a radiation source, through a multi-element projection lens having 10 or more elements grouped to maximize resolution.

10. The method of claim 9 further comprising the steps of:

tiltably mounting said rigid chuck on a moveable stage; and moving said substrate stage and tilting said rigid chuck to position said region of best focus in a previously unexposed portion of said photoresist layer to form a second exposure field.

11. The method of claim 10 wherein said radiation source is an ultraviolet radiation source.

12. The method of claim 11 wherein said rigid chuck is glass or steel.

13. The method of claim 12 wherein the step of permanently shaping an area of an upper surface of a rigid chuck further comprises:

forging or grinding said upper surface of said rigid chuck.

14. The method of claim 13 wherein said substrate is temporarily secured to said rigid chuck by vacuum.

15. The method of claim 14 wherein said smooth permanent curve in said upper surface of said rigid chuck is substantially spherical.

16. The method of claim 14 wherein said smooth permanent curve in said upper surface of said rigid chuck is substantially cylindrical.

* * * * *